United States Patent
Koehl et al.

(10) Patent No.: US 7,865,855 B2
(45) Date of Patent: Jan. 4, 2011

(54) METHOD AND SYSTEM FOR GENERATING A LAYOUT FOR AN INTEGRATED ELECTRONIC CIRCUIT

(75) Inventors: Juergen Koehl, Weil im Schoenbuch (DE); Matthias Ringe, Bonn (DE)

(73) Assignee: International Business Machines Corporation, Armonk, NY (US)

( * ) Notice: Subject to any disclaimer, the term of this patent is extended or adjusted under 35 U.S.C. 154(b) by 107 days.

(21) Appl. No.: 11/942,744

(22) Filed: Nov. 20, 2007

(65) Prior Publication Data

US 2009/0064069 A1 Mar. 5, 2009

(30) Foreign Application Priority Data

Nov. 20, 2006 (EP) .................... 06124364

(51) Int. Cl.
G06F 17/50 (2006.01)
G06F 9/45 (2006.01)

(52) U.S. Cl. ................ 716/6; 716/12; 716/13; 716/14

(58) Field of Classification Search ........ 716/6, 716/8, 9, 10, 12, 13, 14
See application file for complete search history.

(56) References Cited

U.S. PATENT DOCUMENTS

| | | | | |
|---|---|---|---|---|
| 6,904,572 B2 * | 6/2005 | Igarashi | ................... | 716/2 |
| 7,013,438 B1 * | 3/2006 | Saldanha et al. | ............. | 716/2 |
| 7,131,082 B2 * | 10/2006 | Tsukiyama et al. | .......... | 716/4 |
| 7,290,239 B1 * | 10/2007 | Singh et al. | ................. | 716/18 |
| 7,320,117 B2 * | 1/2008 | Nishikawa et al. | .......... | 716/6 |
| 2009/0125859 A1 * | 5/2009 | Alpert et al. | ................ | 716/7 |

FOREIGN PATENT DOCUMENTS

EP 1 557 775 A1 7/2005

OTHER PUBLICATIONS

IBM's Intergrated Data Model, Joseph K. Morrell et al. IEEE/DATC Electronic Design Processes Workshop, Apr. 26-28, 2000 Monterey, CA.
In-Place Timing Optimization, Juergen Koehl, et al., SAME 2000, Oct. 25, 2000.
Verity_A formal verification program for custom CMOS circuits, A. Kuehlmann et al. IBM J. Res. Develop. vol. 39, No. 1/2 Jan./Mar. 1995.

* cited by examiner

*Primary Examiner*—Jack Chiang
*Assistant Examiner*—Magid Y Dimyan
(74) *Attorney, Agent, or Firm*—Richard Kotulak; Roberts Mlotkowski Safran & Cole, P.C.

(57) ABSTRACT

A method for generating a layout for an integrated circuit having a plurality of sinks and at least one source is disclosed. The source supplies a plurality of signals to the respective plurality of sinks. The method includes: identifying the source which supplies at least one of the respective sinks and having a negative slack; finding all sinks having a negative slack driven by the source; clustering the sinks according to timing and placement information read from a database, yielding a plurality of clusters of sinks, in which each cluster includes only a predetermined portion of the plurality of sinks; generating a plurality of clones associated with a respective one of the clusters of sinks; and coupling the clones to respective ones of the clusters of sinks yielding a second layout.

9 Claims, 10 Drawing Sheets

Diagonal rectangle is given by 4 numbers ul, ur, ll, lr

METHOD AND SYSTEM FOR GENERATING A LAYOUT FOR AN INTEGRATED ELECTRONIC CIRCUIT

CROSS REFERENCES TO RELATED APPLICATIONS

This application is related to German Patent Application No. 06124364.8, filed Nov. 20, 2006 and is hereby incorporated by reference.

FIELD OF THE INVENTION

The present invention relates to the manufacturing of integrated electronic circuits, and in particular to their design optimization.

BACKGROUND OF THE INVENTION

The present invention relates to the manufacturing of computer chips, and in particular to chip design optimization, and to a method for developing an electronic chip circuit layout having a plurality of signal source latches and logic, wherein an initial logic is defined by a synthesis step, and during a chip layout generation procedure which processes said synthesized logic, a timing-driven placement for placing cloned latches on said circuit layout is run based on timing data stored for each sink in a database accessible during the method.

SUMMARY OF THE INVENTION

A general introduction into automated chip design optimization is given in EP 1 557 75 A1. When a signal source latch drives a plurality of sinks, some signals do not reach the sinks within the required cycle time. In those cases, repeaters or "pipeline latches" are inserted into a respective signal path having timing failure.

EP 1 557 775 A1 shows a method of inserting pipeline latches into the chip layout after wiring the chip, i.e., when timing data and estimations of the wiring parasitics exist. This method, however, does not optimize the location of data sinks such that signals arrive within a single cycle.

Figure 1:
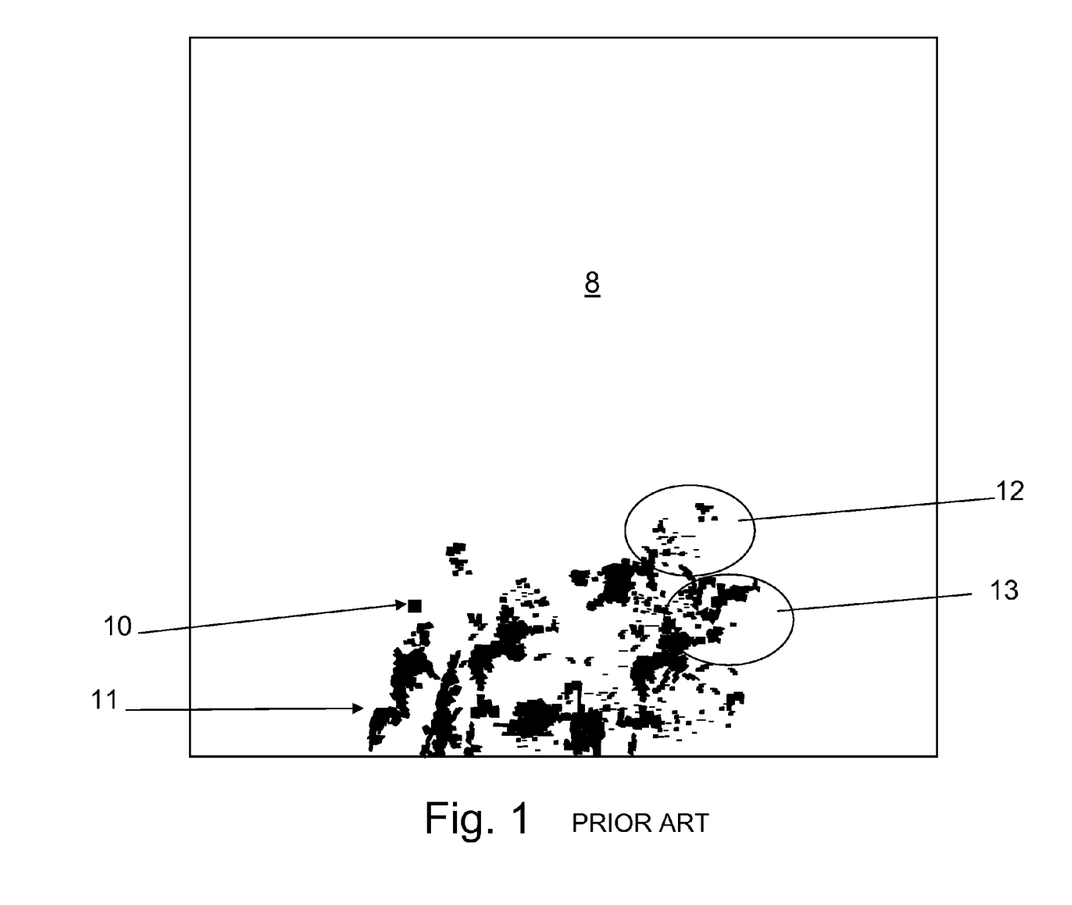
FIG. 1 is a display output of a chip design tool illustrating the physical layout (8) of parts of an electronic circuit, wherein one source latch (10) and an agglomeration of about 20,000 sinks (11) associated with the source latch (10) is depicted.

FIG. 1 illustrates this situation for a single cycle: A source latch 10 feeds its signal to about 20,000 sinks 11, which are depicted in a dense agglomeration of printed dots thus provoking the impression of a land map formed by sinks 11. FIG. 1 illustrates the fact that a major portion of sinks 11, see for example region 12 and region 13 on chip 8, are physically located remotely from source latch 10. These long distances impose significant timing restrictions to the circuit layout.

A description of the above-mentioned problem is given in: Koehl, Schietke: "In-place Timing Optimization", Proceedings of SAME, Sophia Antipolis, 2000 (Koehl). The Koehl article gives background information, which explains the difficulties of realizing an effective integration method of synthesizing and generating the layout. Synthesis typically uses a wire load model which describes the average capacitance and resistance of the final wiring of a VLSI design (very large scale integrated circuit). The capacitance and resistance estimates depend on the number of pins in the net, the area of the logical function the net belongs to, or other more sophisticated criteria. The final wiring may significantly differ from these estimates and thus the structure of the logic generated during synthesis may be sub-optimal for the final wiring. Statistics show that most of the loads are smaller than the average but there are several cases where the capacitance is several times larger than the average used in synthesis. Some methods perform drive strength optimization, including back-annotating post wiring capacitances and resistances to a timing analysis tool, which chooses the appropriate drive strength for each circuit under analysis. The method performs a "repeater insertion" operation to generate a placement for a repeater in order to generate reliable wiring estimates after repeater insertion. Such repeaters are also referred to herein as "cloned latches".

In order to closely integrate synthesis and layout two possible choices are discussed in the Koehl document: first, a back annotation of the placement to synthesis, and second, timing optimization in the layout framework.

The aforementioned method does not offer a solution to the problem of very wide data paths: this is a crucial point of interest because the available complexity in advanced semiconductor technologies is often used to increase the throughput by widening those data paths. Wide data paths, however, lead to respective high logic fan-out in the sense that a cone of logic which is driven by a single latch may end at many thousands of sinks. A sink in this context is to be understood as a pin that is a part of a timing test and is a cause of timing violations.

The amount of time by which a timing violation is avoided is called a "slack". For example, for a setup constraint, if a signal must reach a cell input at no later than 8 ns and is determined to arrive at 5 ns, the slack is 3 ns. A slack of 0 means that the constraint is just barely satisfied. A negative slack indicates a timing violation.

Typically sinks are data inputs to latches and clock gating circuits. The term "latch" used herein refers to any kind of data storage circuit. Other examples of data storage circuits include registers and flip flops. A design characterized by high logic fan-out makes timing closure with aggressive clock frequencies nearly impossible. The capacitance of a simulated net may easily be six or more times higher than the average net capacitance. Such deviations cannot be tolerated when a design requires ambitious clock rates.

Disclosed is a method and respective system to clone latches and to assign sinks to each of the cloned latches using the physical location of the sinks, and the timing criticality of each sink.

The method may be implemented in an existing tool used for chip design. A preferred feature is to implement an Add-On in a logic optimization tool, as the method is based on a pre-existing logic circuit scheme, and as yet unavailable physical layout of the logic. It can also be implemented in a stand-alone optimization tool having a database with access to the chip design database.

A rough sketch of a preferred control flow of the inventive method includes the steps as follows: The first step is to perform a timing driven placement of the initial logic and run timing optimization algorithms. The second step is to find a latch having a negative slack at its output pin. The third step is to find a set of sinks driven by this latch. In a fourth step the method clusters a sink set according to timing and placement information.

Figure 4:
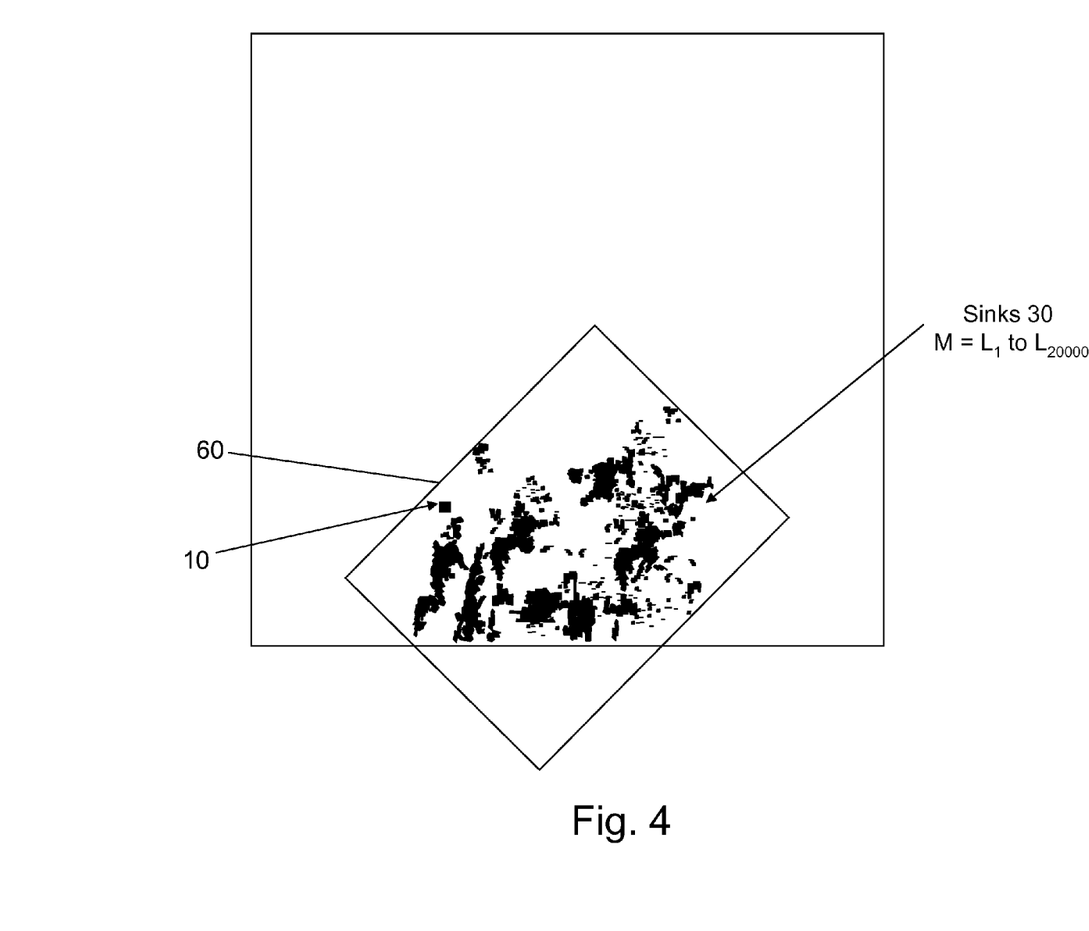
FIG. 4 is an illustration according to FIG. 1, including a diagonal-shaped area (60) to cover all sinks (30) (which is called the bounding box of sinks (30)) of the source latch (10)

Preferably the step of clustering the sinks can be done as follows: assigning all sinks with positive or zero slack to one cluster and clustering, i.e. arranging the remaining sinks as shown in FIG. 4 (described below). The objective is to cover the negative slack sinks with the minimum number of circles in the Manhattan (or L1) metric up to a certain maximum radius.

The fifth step is to clone source latches and logic as shown and described later with reference to FIG. 3, and couple the individual clusters of latches. The sixth step is to re-run the timing driven placement and feed the control back to the second method step. The method subsequently continues with the next source latch having a negative slack. This loop continues until all latches having a negative slack have been processed.

According to its broadest aspect, the present invention discloses a method for developing an integrated circuit layout having a plurality of latches and logic, wherein source latches supply signals to a respective plurality of sinks. During a subsequent chip layout generation procedure (processing the synthesized logic) the method performs a placement algorithm which places cloned latches associated with a single source latch on the circuit layout. The method is characterized by the steps of:

a) identifying latches having a negative slack, which have at least one associated sink, i.e. the latches having a negative slack at their output;

b) finding all sinks N, driven by a respective one of the identified latches, where N is predetermined by heuristics;

c) clustering the sinks according to timing and placement information read from a chip design database, thus yielding a plurality of clusters of sinks, in which each cluster includes only a predetermined fraction of the N sinks;

d) generating cloned latches associated with the pre-identified source latch;

e) coupling the cloned latches to respective ones of the clusters of sinks, yielding an improved chip layout.

The placement of the cloned latches is timing-driven, based on timing data stored for each sink in a database accessible during the method.

The step of clustering the sinks includes the defining contiguous sub-areas (enclosed by bounding boxes), preferably diamond shaped rectangles of the layout, which encompass in-lying sinks, and the sub-area enclosed by the bounding box is limited to only a predetermined fraction of sinks in relation to N. The diamond shaped bounding box is defined in relation to the orthogonal axes of the orthogonal coordinates system defining the wiring directions such that the edges of the diamond are oriented in 45° directions to either of the orthogonal axes (see FIG. 4).

Diamond shaped areas have the advantage of the smallest maximum distance from the center of the area to any point covered by the area in L1 (or Manhattan) distance. Assuming that the delay is significantly influenced by the maximum distance from the latch placed in the center of an arbitrarily shaped area covering N sinks, a diamond shaped area yields the minimum delay and therefore the maximum slack.

The method further comprises the steps of:

a) defining a predetermined starting location at the border of the smallest sub-area enclosing all sinks being used to define the totality of N sinks, b) defining at the starting location a diamond-like sub-area that initially comprises a small number of sinks, c) increasing the sub-area in size, and concurrently counting the sinks comprised thereof, until the size is large enough to comprise the predetermined portion of sinks, d) assigning the enclosed sinks to this sub-area, e) removing these sinks from the set of total sinks N, and f) repeating the foregoing steps beginning with a starting location identical to or different from the preceding one.

The purpose of this method is to create sub-areas that comprise a portion of the total number of sinks. By creating diamond-shaped areas the following timing optimization will be steered such that the delay from the latch to any of its sinks will be minimized.

The method further comprises the steps of redoing the timing driven placement of the cloned repeater latches based on the improved chip layout. The purpose of this step is to find optimum locations for the source latch and its newly created clones and to increase the slack of their corresponding sinks by reducing the delay.

The method further comprises the steps of synthesizing based on the improved chip layout.

Although the Boolean function is identical to the original system the boundary conditions (e.g. fan-in, fan-out) of the logic cones are different allowing for a further slack increase by re-synthesizing the combinatorial logic cones starting at both the source and newly created latches.

BRIEF DESCRIPTION OF THE DRAWINGS

The present invention is illustrated by way of example and is not limited by the shape of the figures of the drawings in which.

DETAILED DESCRIPTION

A preferred embodiment of the present invention can be implemented in a chip layout tool or timing optimization tool.

Further, the changes applied to the chip design need to be verified by a formal verification tool for logic circuits, as for example "Verity" as described in IBM, Journal of Research and Development, Vol. 39, No. 1/2, January, March 1995. In particular, the Boolean function of the chip must not be altered.

The following notes are provided to clarify how one verifies the correctness of the change performed by the method.

Figure 3A:
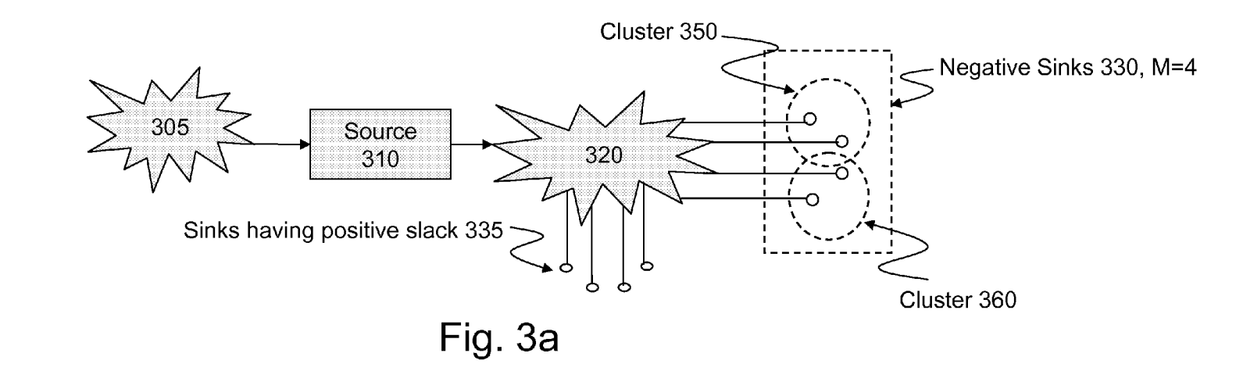
FIGS. 3a and 3b show an illustration of a principle of source cloning according to an embodiment of the invention.

FIG. 3a shows a digital system which includes combinatorial logic (305) and storage elements. Most storage elements are Latches (e.g. source 310) which have one data and one clock input, and one output. An edge triggered flip flop for example typically contains two latches.

Figure 3B:
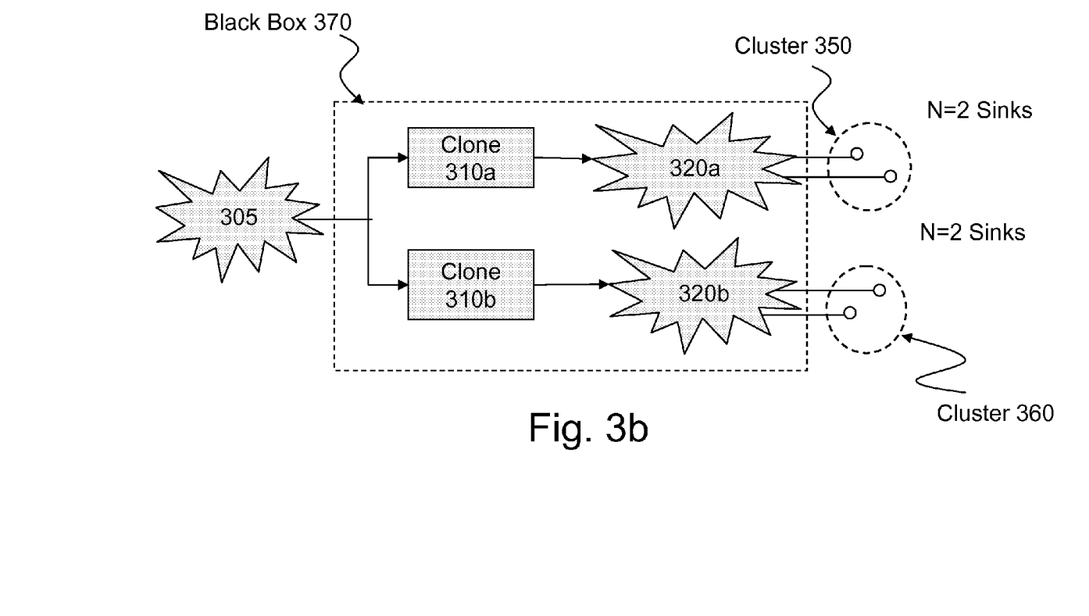

FIG. 3b illustrates that any storage element may be cloned to generate one or more clones 310a and one or more combinatorial logic 320a, 320b. Black box (370) comprises an input from logic 305 and the outputs from logic 320a and 320b. For Boolean verification purposes any circuit may be declared a black box. Black box 370 has a unique identifier and unique input and output pins, but functions exactly the same as the original, uncloned logic 320.

Figure 9:
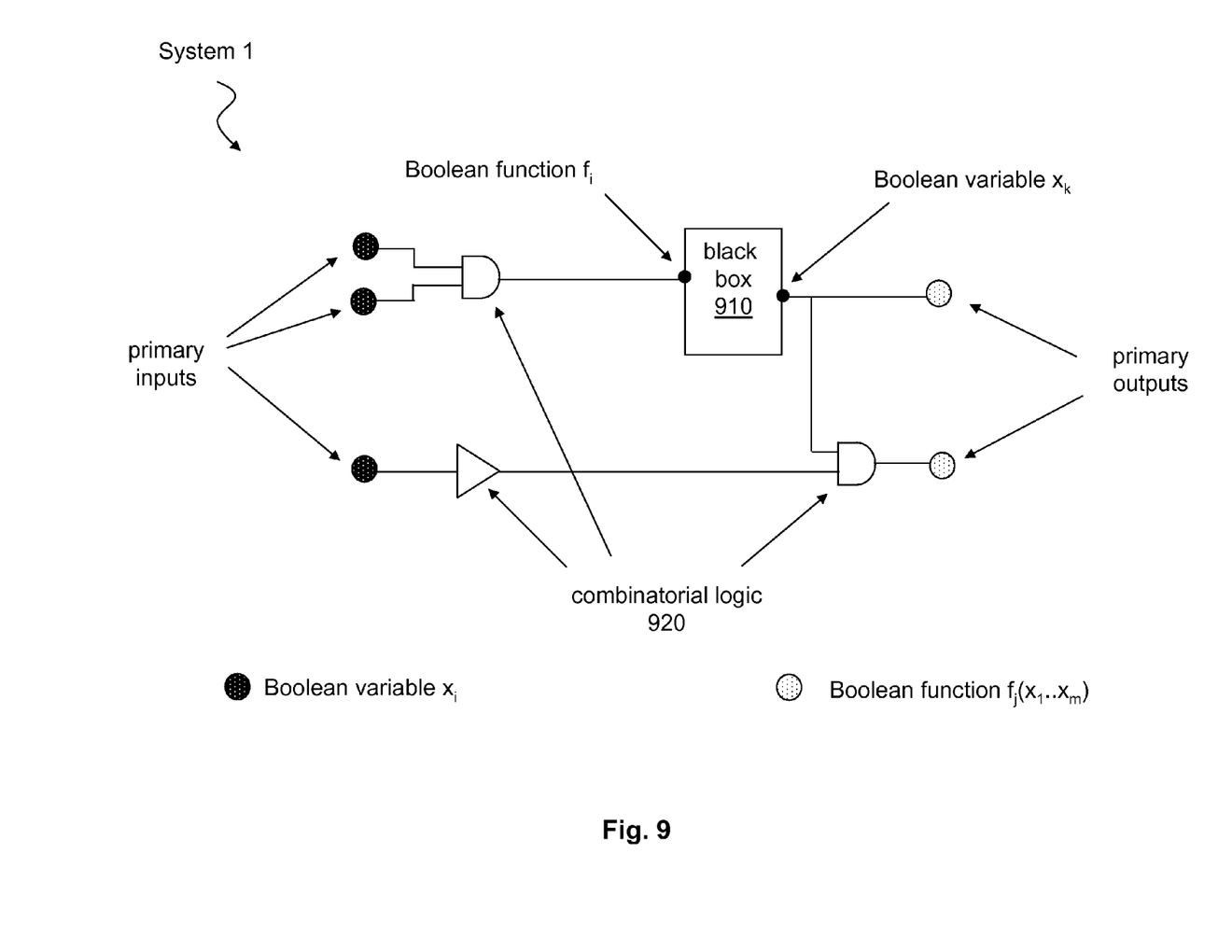
FIGS. 9 an 10 illustrate a system for logic verification according to an embodiment of the invention.

Referring to FIG. 9, all primary inputs and all black box (910) outputs are assumed to be independent Boolean variables ($x_1, \ldots, x_m$). All primary outputs and all black box 910 inputs have a combinatorial function f depending on primary inputs and black box (910) outputs: $f_i(x_1, \ldots, x_m)$, with i being a member of the set $[1, \ldots, p]$ being the i-th of p primary outputs or black box 910 inputs.

Figure 10:
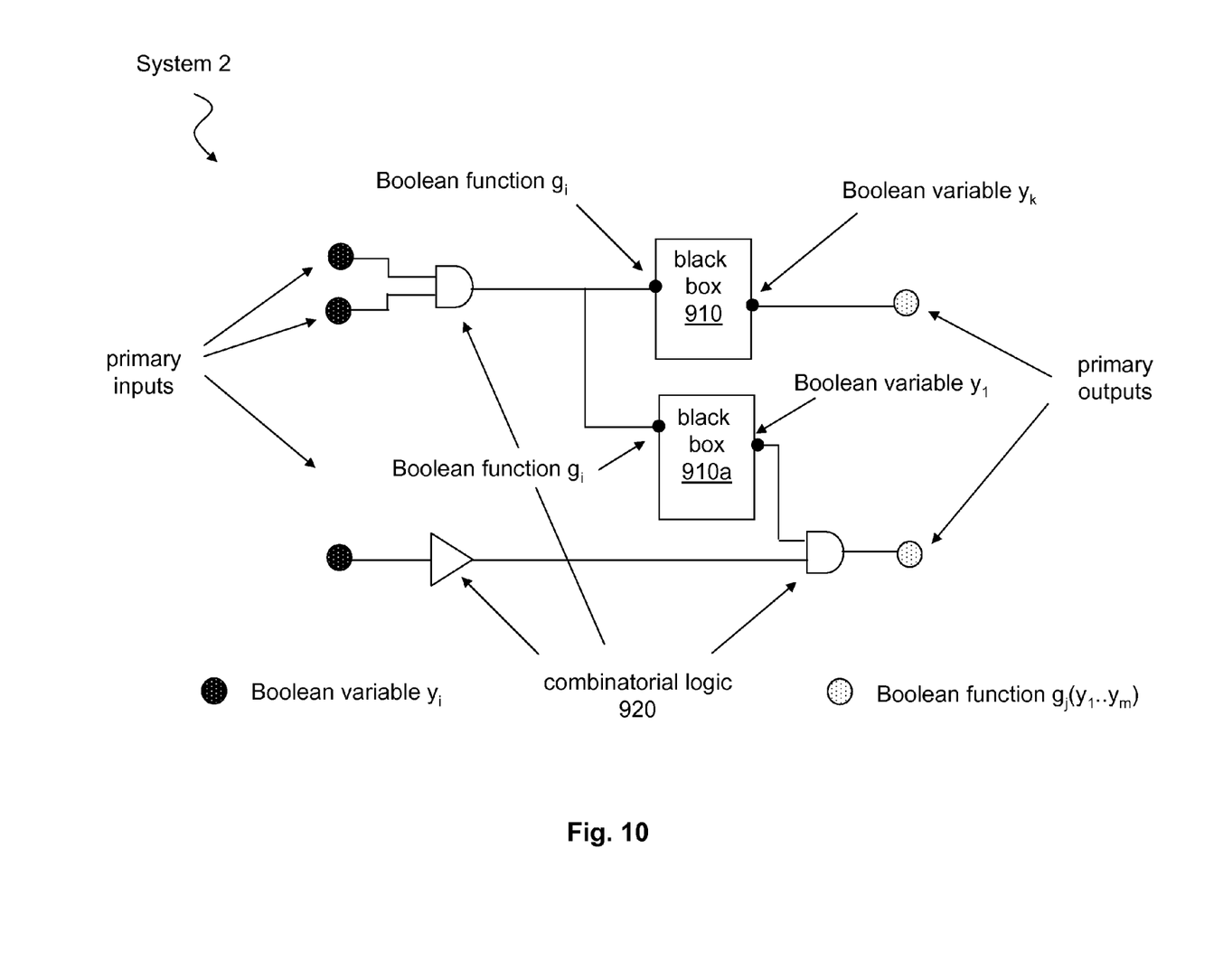

Boolean verification compares two digital systems (shown in FIGS. 9 and 10 respectively). Let $x_1, \ldots, x_m$ be the independent variables and $f_i$ the Boolean functions of system 1, and $y_1, \ldots, y_n$ the independent variables and $g_j$ the Boolean functions of system 2. System 1 has p primary outputs and black box 910 inputs and system 2 has q primary outputs and black box (910) inputs.

A standard Boolean verification tries to prove that $$m=n \quad \text{equation (1)}$$

$$p=q \quad \text{equation (2)}$$

$$x_k=y_k \text{ (for each k)} \quad \text{equation (3)}$$

$$f_i=g_i \text{ (for each i)} \quad \text{equation (4)}$$

The first three equations describe a process called "correspondence". Equation (4) describes "Boolean comparison".

Cloning a storage element poses a challenge on Boolean verification since m≠n and p≠q due to the introduction of cloned black box (910a) inputs and outputs. Original system 1 and system 2, which contains 1 cloned black box (910a) with one input and one output. The correspondence can be established by declaring the original black box 910 and its clone (910a) to be equivalent. The independent variable of black box (910) output is called $x_k$ in system 1 and is called $y_k$ in system 2. Black box (910) input function will be called $f_i$ and $g_i$. Black box (910a) output variable will be called $y_1$, and black box (910a) input function $g_j$.

The additional independent variable $y_1$ is actually not independent but equal to the independent variable of black box (910) output $y_k$ in system 2 and $x_k$ in system 1: $y_1=y_k=x_k$. The Boolean comparison then must try to prove that $g_j=g_i=f_i$. This technique can be used for multiple cloned black boxes with multiple inputs and outputs.

For the Boolean verification using the above mentioned software Verity, cloned circuits need to be declared in a manual correspondence file (m2_manual_correspondence) in the Verity setup. This file declares one circuit in system 1 and one or multiple circuits in system 2 to be equivalent. A syntax example is:

box latchA {latchA latchA_clone1 latchA_clone2}

Verity performs correspondence and Boolean comparison automatically. This behavior has been verified both for correct and incorrect latch cloning according to the latch cloning method described herein.

Figure 2:
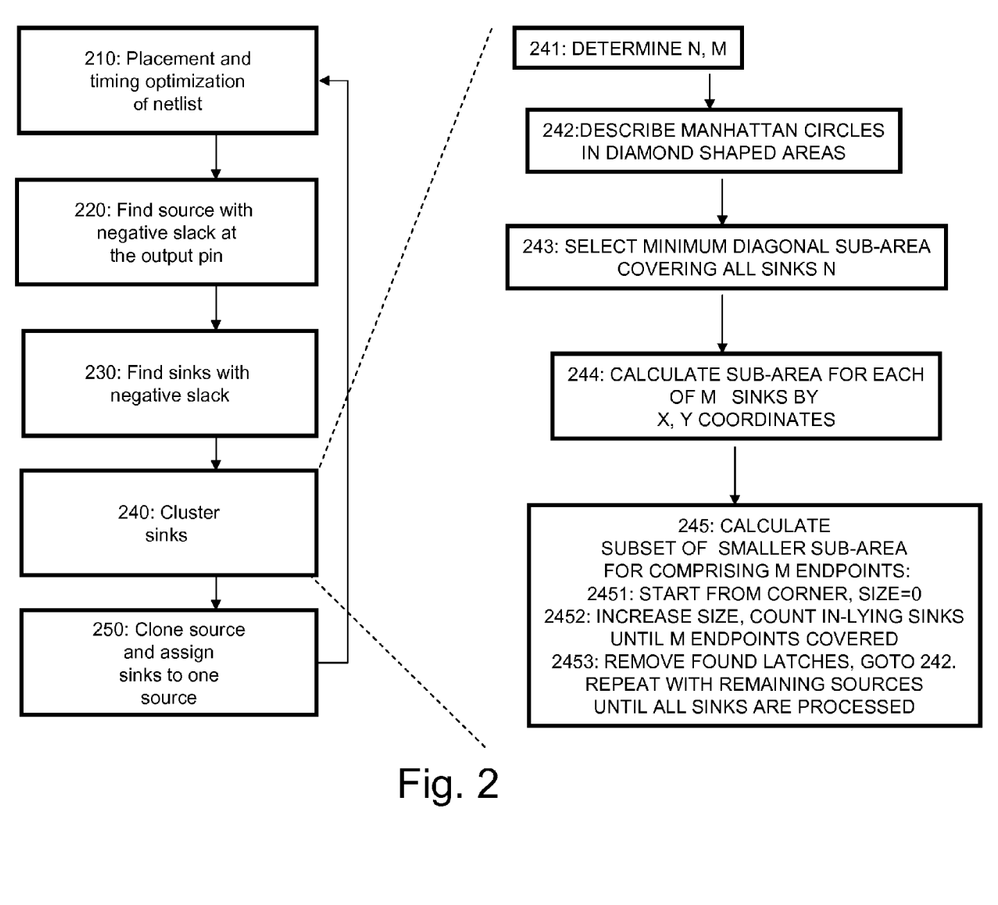
FIG. 2 is a schematic description of basic steps of a control flow in a method according to a preferred embodiment of the invention.

FIG. 2 shows a flow diagram of the method: In a step 210, after logical synthesis of the circuit under development an initial logic description of the hardware logic of the chip circuit is present in the form of a netlist stored in an associated database, for example an IBM integrated data model described in K. Morell, D. J. Hathaway, "IBM's Integrated Data Model", IEE/DATC Electronic Design Processes Workshop, Apr. 26-28, 2000, Monterey, Calif. This data model describes the logic circuits used for the implementation, the logic connection between these circuits, the physical location of each circuit, the required cycle time and other timing requirements. Based on the timing requirements, slacks are calculated for each timing test and propagated back to the signal's originating circuit.

In step 220 the method identifies source (310) having a negative slack at the output pin (see FIG. 3). This means identifying source (310) which supplies signals to its sinks (330, 335), wherein at least one sink exists which in turn has a negative slack, i.e. the sink at which the signal from source (310) arrives too late to meet timing requirements. It should be noted that depending on the design tool, source (310) may be denoted as having a negative slack, although the actual negative slack occurs at the sink supplied by source (310). The remaining sinks (335) having positive slacks are not processed any further.

In step 230 all sinks (330) driven by source (310) having a negative slack are identified. This is done in a dialog form by reading the database and selecting all sinks (330) having negative slack which are associated with source (310) having the negative slack.

In step 240 sinks (330) having a negative slack found in step 230 are grouped into clusters (350 and 360) according to timing and placement information residing in the design tool's database. As this step is an essential step of the present embodiment the clustering step is described in more detail at the right side of FIG. 2 as follows:

Step 241: DETERMINE N, M: for example, let the number N equal the maximum number of sinks (330, 335) driven by a single source (310), and the number M equal the number of sinks (30) connected to source (310), e.g. 20,000. N is a user parameter and depends on the clock frequency, therefore N=500 is an appropriate value for a 250 Mhz design.

Step 242: areas 60, 52, and 54 (see FIGS. 4 and 5), also referred to as diamond-shaped or (diagonal shaped) rectangles, are used to describe minimum distance "circles" in Manhattan distance. The dimensions of diagonal area 60 is identified by four numbers describing the upper right (ur), upper left (ul), lower left (ll) and lower right (lr) border, respectively (see FIG. 6).

Step 243: The smallest area 60 is chosen to cover all latches N (e.g. 500).

Figure 5:
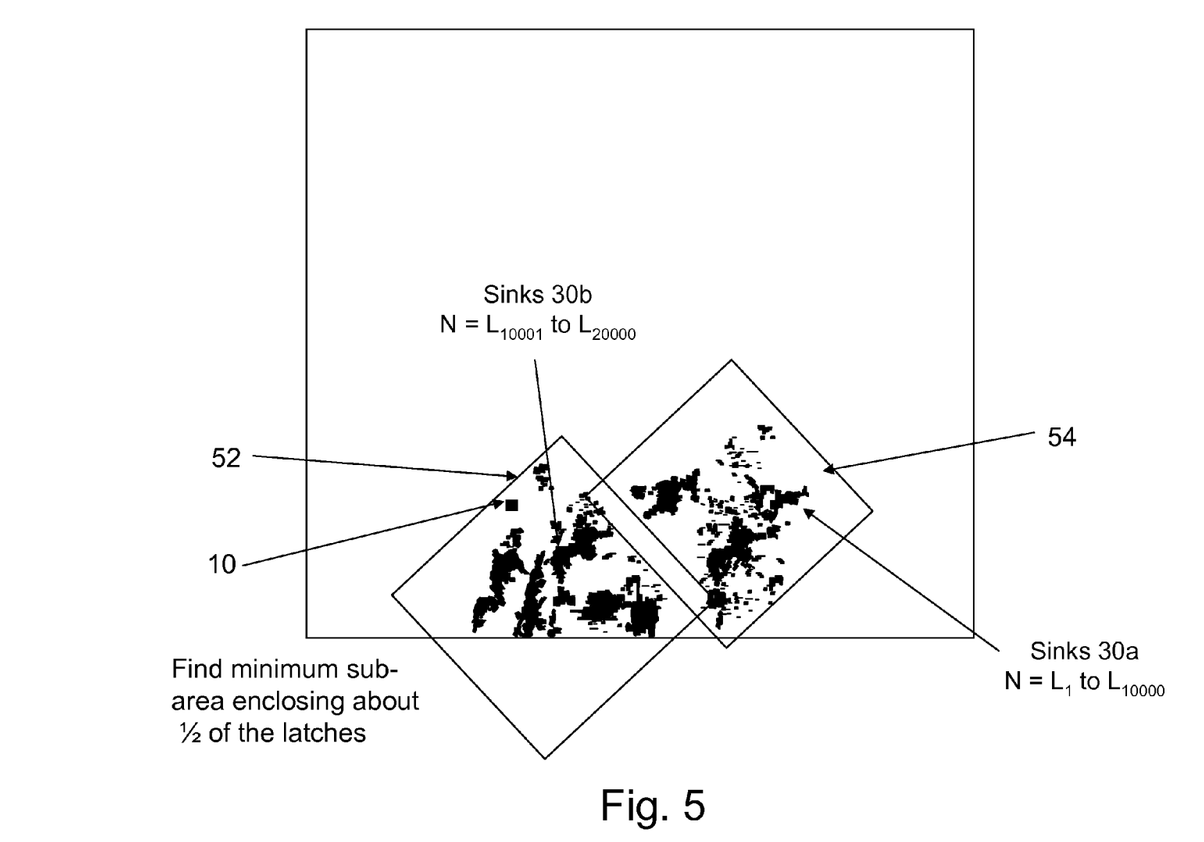
FIG. 5 is a depiction according to FIG. 1 showing the clustering of sinks (30), and introducing the generation of bounding boxes (52, 54) enclosing some predetermined portion of the sinks (30)

FIG. 5 illustrates the case where N=10,000 and M=20,000. For the purposes of simplicity and improved clarity, in the foregoing example there are only two (20,000 divided by 10,000) different areas to be defined. For all 20,000 sink latches $L_i$ (for i=1 to 20,000) their x and y coordinates are selected from the database.

Figure 6:
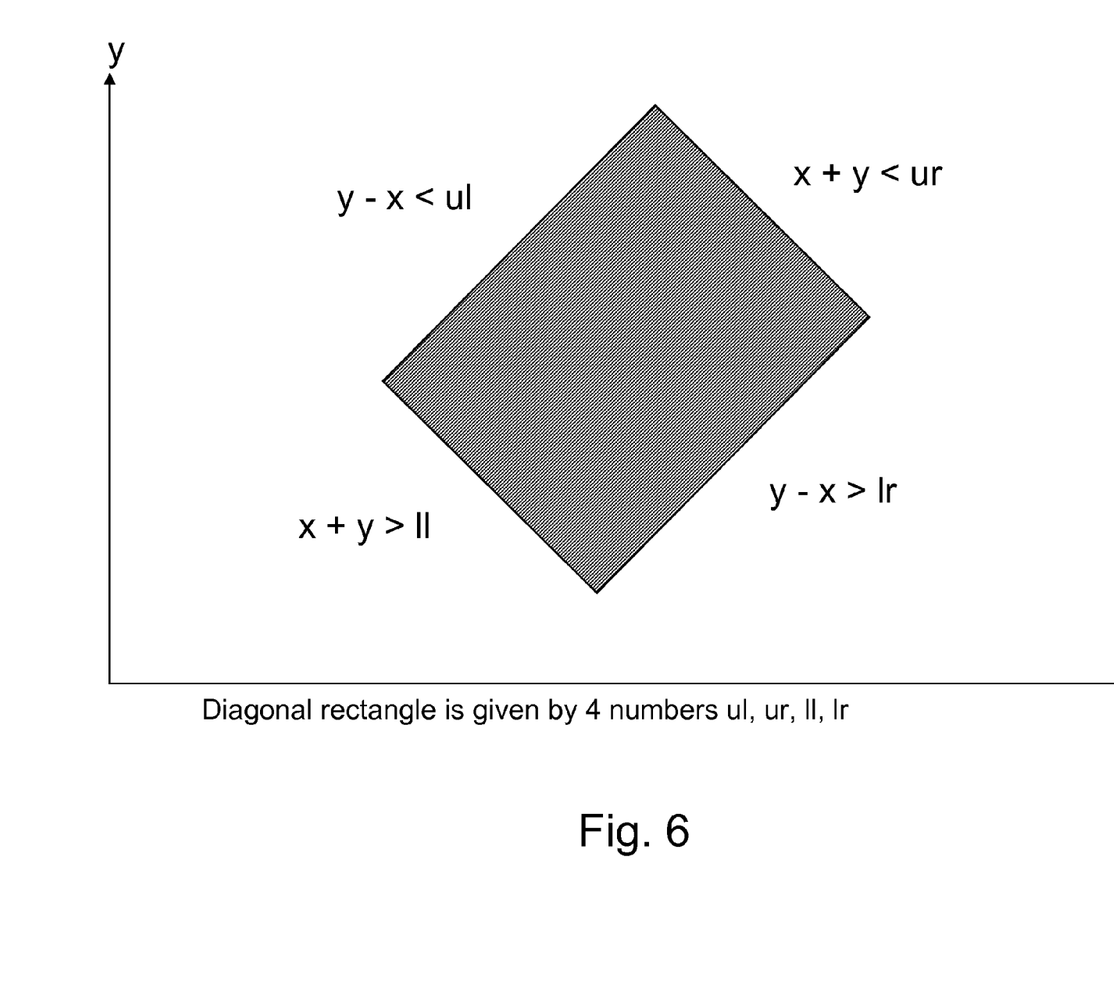
FIG. 6 is a schematic illustration of area (60) and its notation in relation to a Cartesian coordinate system (fixed to the integrated circuit layout)

Step 244: for each of the M sinks a diamond-shaped area (60) is calculated by ul, ll, ur, lr, wherein ur=max $\{x_i+y_i\}$, ll=min $\{x_i+y_i\}$, ul=max $\{y_i-x_i\}$, lr=min $\{y_i-x_i\}$ where $(x_i, y_i)$ is the coordinate of latch $L_i$ (see FIG. 6)

Step 245: A next step constructs smaller diagonal sub-areas 52 and 54 that cover the set of sinks 30 and assigns to each sink (30) exactly one (typically smaller) diagonal sub-area (52 or 54) in such a way that each sink (30) is inside the diagonal sub-area (52 or 54) it is assigned to. The number of sinks 30 assigned to each diagonal sub-area (52 or 54) is below N. For example, the algorithm at step 2451 (see FIG. 7) starts in the east corner of the larger diagonal area (60) generated in step 243 and increases, step 2452, the size of a smaller diagonal sub-area (54) until it covers as close as possible to but not exceeding N sinks (30a).

Figure 8:
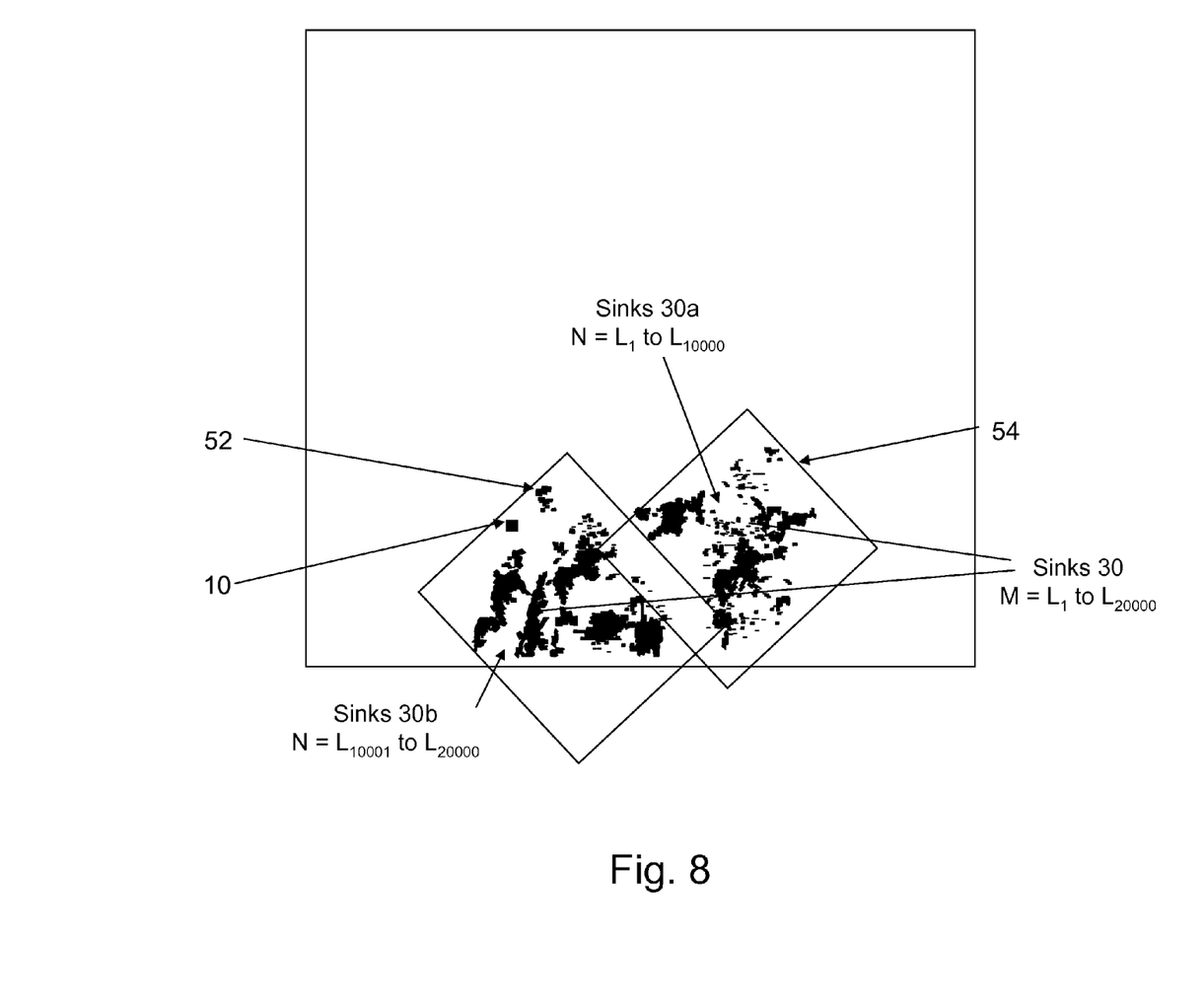

In Step 2543 program control removes sinks (30a) encompassed by sub-area (54) and goes to step 242 to construct a new diagonal area (52) enclosing all remaining sinks (30b). This is illustrated by FIG. 8.

The process is terminated if a new diagonal area does not enclose more than N latches.

By completing this procedure, diamond shaped sub-areas (52), and (54) are found, generally having different, (i.e. smaller size) and different, (i.e. equal or smaller) edge lengths covering all sinks (30) of the whole area (60) in FIG. 4.

Figure 7:
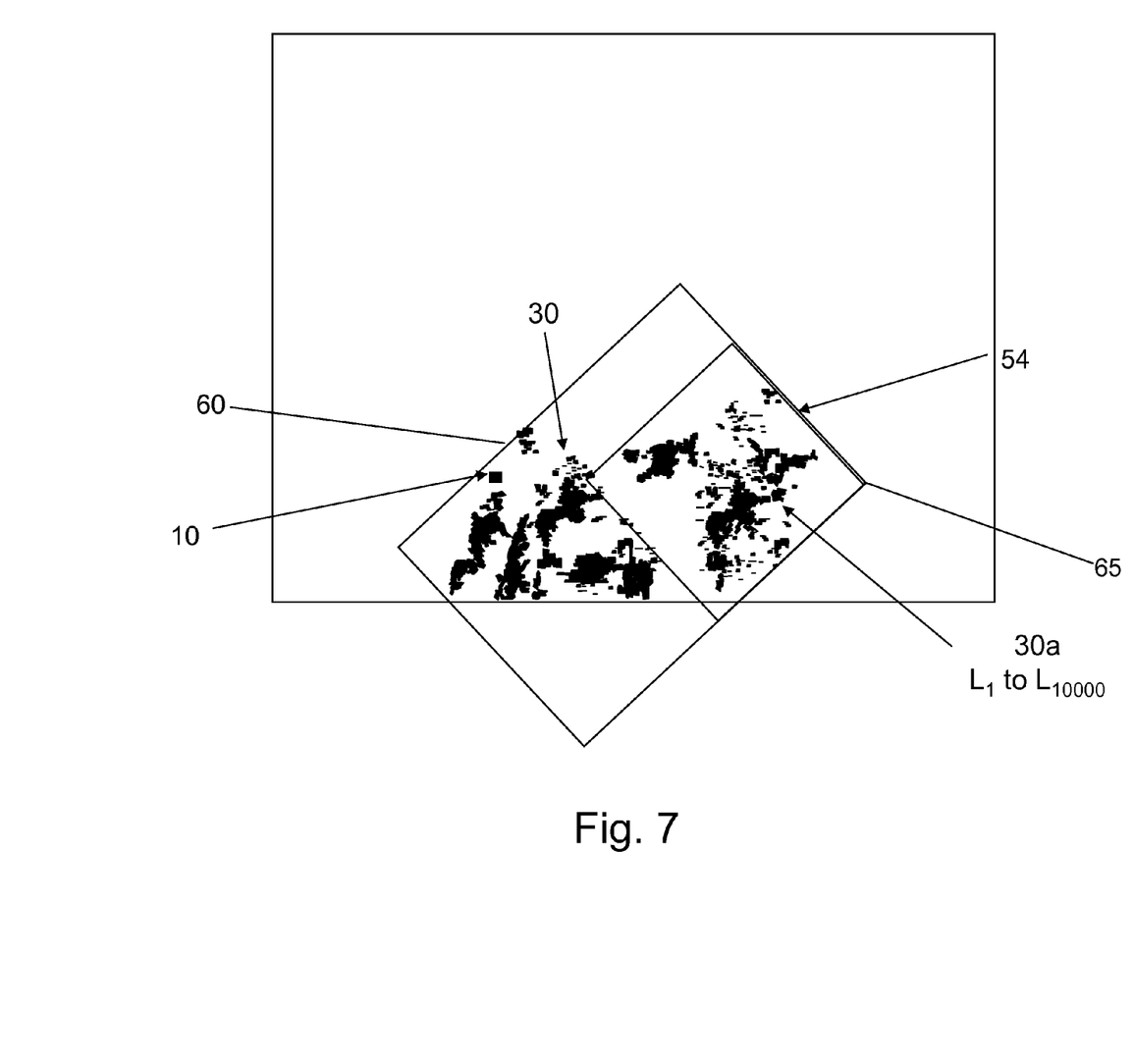
FIGS. 7 and 8 are illustrations which exemplify a method of generating diagonal-shaped areas.

FIG. 7 shows the construction of the first bounding box (54). FIG. 8 shows all areas (52) and (54) (2 in this particular case). Note that each sub-area (52 or 54) is smaller than the original area (60).

Depending on the case, it may be preferable to alter the starting corners by selecting a next start point rotated in relation to the preceding one (65). For example, beginning at the southern-most corner of area (60).

The present invention can be realized in hardware, software, or a combination of hardware and software. A chip layout or a timing optimization tool according to the present invention can be realized in a centralized fashion in one computer system or in a distributed fashion where different elements are spread across several interconnected computer systems. Any kind of computer system or other apparatus adapted for carrying out the methods described herein is suitable. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which, when loaded in a computer system, is able to carry out these methods.

Computer program means or computer program in the present context means any expression, in any language, code or notation, of a set of instructions intended to cause a system having an information processing capability to perform a particular function either directly or after either or both of the following A) conversion to another language, code or notation;
B) reproduction in a different material form.

The invention claimed is:

1. A method for generating a layout for an integrated circuit having a plurality of sinks and at least one source, the source supplies a plurality of signals to the respective plurality of sinks, wherein a first logic is defined by a synthesis step, and wherein during a first layout generation procedure, a placement algorithm for placing a plurality of clones associated with the source on said first layout is performed, the method comprising:

identifying the source which supplies at least one of said respective sinks and having a negative slack;
finding all sinks having a negative slack driven by the source;
clustering said sinks according to timing and placement information read from a database, yielding a plurality of clusters of sinks, in which each cluster includes only a predetermined portion of said plurality of sinks;
generating a plurality of clones associated with a respective one of said clusters of sinks; and
coupling said clones to respective ones of said clusters of sinks yielding a second layout,
wherein the identifying, the finding, the clustering, the generating, and the coupling are performed by one of a chip layout tool and a timing optimization tool in a computer system.

2. The method according to claim 1, wherein the step of clustering said sinks comprises generating an area of the first layout, which comprises the plurality of sinks.

3. The method according to claim 2, wherein said area is a diagonal rectangle having edges oriented in a 45° direction in relation to an orthogonal axis of an orthogonal coordinates system defining a plurality of wiring directions on the integrated circuit.

4. The method according to claim 3, further comprising:
a) defining a predetermined starting location at the border of the area required to enclose N sinks;
b) defining at said starting location a first sub-area;
c) increasing said first sub-area dimensionally, and concurrently counting the plurality of sinks within the first sub-area, until the first sub-area comprises said predetermined portion of sinks;
d) assigning said pre-determined portion of sinks to the first sub-area;
e) removing said pre-determined portion of sinks from the set of the plurality of sinks; and
f) repeating the foregoing steps beginning with a starting location identical to or different from the preceding starting location.

5. The method according to claim 4, further comprising: performing a timing driven placement of said clones based on said second layout.

6. The method according to claim 1, further comprising: resynthesizing said second layout.

7. The method of claim 1, wherein the computer system comprises hardware and software.

8. A computer program product for execution in a data processing system, for generating a layout for an electronic integrated circuit having a plurality of sinks and at least one source, the source supplies a plurality of signals to the respective plurality of sinks, wherein a first logic is defined by a synthesis step, and wherein during a first layout generation procedure, a placement algorithm for placing a plurality of clones associated with the source on said first layout is performed, comprising computer program code portions loaded in a computer system that, when executed, cause the computer system to perform the steps of:

identifying the source which supplies at least one of said respective sinks and having a negative slack;
finding all sinks having a negative slack driven by the source;
clustering said sinks according to timing and placement information read from a database, yielding a plurality of clusters of sinks, in which each cluster includes only a predetermined portion of said plurality of sinks;
generating a plurality of clones associated with a respective one of said clusters of sinks; and
coupling said clones to respective ones of said clusters of sinks yielding a second layout.

9. The computer program product of claim 8, wherein the computer system that the computer program code portions are loaded into comprises hardware and software.

* * * * *